United States Patent
Csutak et al.

(10) Patent No.: US 6,656,761 B2
(45) Date of Patent: Dec. 2, 2003

(54) METHOD FOR FORMING A SEMICONDUCTOR DEVICE FOR DETECTING LIGHT

(75) Inventors: Sebastian M. Csutak, Houston, TX (US); Burt W. Fowler, Mountain City, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/990,977

(22) Filed: Nov. 21, 2001

(65) Prior Publication Data

US 2003/0096440 A1 May 22, 2003

(51) Int. Cl.$^7$ .............................................. H01L 21/00
(52) U.S. Cl. ........................ 438/57; 438/7; 438/31; 438/32; 438/48; 438/72; 438/97
(58) Field of Search ........................ 438/72, 97, 48, 438/7, 31–32, 57

(56) References Cited

U.S. PATENT DOCUMENTS

| | | | | |
|---|---|---|---|---|
| 4,904,083 A | * | 2/1990 | Lu et al. | 356/469 |
| 5,063,569 A | * | 11/1991 | Xie | 372/45 |
| 5,331,658 A | * | 7/1994 | Shieh et al. | 372/50 |
| 5,493,577 A | * | 2/1996 | Choquette et al. | 372/46 |
| 5,600,173 A | * | 2/1997 | Suzunaga | 257/446 |
| 5,633,527 A | * | 5/1997 | Lear | 257/432 |
| 5,654,559 A | * | 8/1997 | Spaeth et al. | 257/82 |
| 5,724,376 A | * | 3/1998 | Kish, Jr. et al. | 372/96 |
| 5,828,088 A | | 10/1998 | Mauk | |
| 5,926,317 A | * | 7/1999 | Cushing | 359/588 |
| 5,956,363 A | * | 9/1999 | Lebby et al. | 372/46 |
| 5,977,604 A | * | 11/1999 | Babic et al. | 257/466 |
| 5,985,686 A | * | 11/1999 | Jayaraman | 438/32 |
| 6,001,667 A | * | 12/1999 | Saitoh et al. | 438/57 |
| 6,005,262 A | * | 12/1999 | Cunningham et al. | 257/84 |
| 6,061,381 A | * | 5/2000 | Adams et al. | 372/96 |
| 6,074,892 A | | 6/2000 | Bowers et al. | |
| 6,121,068 A | * | 9/2000 | Ramdani et al. | 438/39 |
| 6,134,049 A | * | 10/2000 | Spiller et al. | 359/590 |
| 6,150,190 A | | 11/2000 | Stankus et al. | |
| 6,180,496 B1 | | 1/2001 | Farrens et al. | |
| 6,222,206 B1 | * | 4/2001 | Chirovsky et al. | 257/98 |
| 6,233,267 B1 | * | 5/2001 | Nurmikko et al. | 372/46 |
| 6,277,696 B1 | * | 8/2001 | Carey et al. | 438/289 |
| 6,282,219 B1 | * | 8/2001 | Butler et al. | 372/50 |
| 6,284,629 B1 | | 9/2001 | Yokokawa et al. | |
| 6,309,950 B1 | | 10/2001 | Forbes | |
| 6,312,797 B1 | | 11/2001 | Yokokawa et al. | |
| 6,320,206 B1 | * | 11/2001 | Coman et al. | 257/94 |
| 6,340,788 B1 | * | 1/2002 | King et al. | 136/261 |
| 6,429,463 B1 | * | 8/2002 | Mauk | 257/98 |
| 2001/0027021 A1 | * | 10/2001 | Yao et al. | 438/694 |
| 2002/0093025 A1 | * | 7/2002 | Malone | 257/98 |
| 2002/0102815 A1 | * | 8/2002 | Hashimoto et al. | 438/435 |

OTHER PUBLICATIONS

R.T.Carline et al., "Long–wavelength SiGe/Si resonant cavity infrared detector using a bonded silicon–on–oxide reflector", Applied Physics Letters, vol. 68, No. 4, Jan. 22, 1996, pp. 544–546.*

Cheng Li et al., "$Si_{1-x}Ge_x$/Si resonant–cavity–enhanced photodetectors with a silicon–on–oxide reflector operating near 1.3 $\mu$m", 2000 American Institute of Physics, Applied Physics Letters, vol. 77, No. 2, Jul. 10, 2000, pp. 157–159.*

(List continued on next page.)

*Primary Examiner*—Zamir Amir Zarabian
*Assistant Examiner*—Ida M. Soward
(74) *Attorney, Agent, or Firm*—Kim-Marie Vo; Joanna G. Chiu

(57) ABSTRACT

A method of forming a resonant cavity device useful for optoelectronic applications is disclosed. A monocrystalline top semiconductor substrate is wafer bonded to a mirror formed over or within a bottom semiconductor substrate. A top mirror is formed over or within the top semiconductor substrate.

9 Claims, 3 Drawing Sheets

OTHER PUBLICATIONS

Yukari Ishikawa et al., "Epitaxy–ready Si/SiO$_2$ Bragg reflectors by multiple separation–by–implanted–oxygen", 1996 American Institute of Physics, Appl. Phys. Lett., vol. 69, No. 25, Dec. 16, 1996, pp. 3881–3883.*

J.D.Schaub et al., "Resonant–Cavity–Enhanced High–Speed Si Photodiode Grown by Epitaxial Lateral Overgrowth", 1999 IEEE Photonics Technology Letters, vol. 11, No. 12, Dec. 1999, pp. 1647–1649.*

Gerold W. Neudeck et al., "Selective Epitaxial Growth Si Resonant–Cavity Photodetector", 1998 IEEE Photonics Technology Letters, vol. 10, No. 1, Jan. 1998, pp. 129–131.*

J.C. Bean et al., "High–Speed Polysilicon Resonant–Cavity Photodiode with SiO$_2$–Si Bragg Reflectors", 1997 IEEE Photonics Technology Letters, vol. 9, No. 6, Jun. 1997, pp. 806–808.*

Z.–H. Zhu et al., "Wafer Bonding Technology and Its Applications in Optoelectronic Devices and Materials", 1997 IEEE Journal of Selected Topics In Quantum Electronics, vol. 3, No. 3, Jun. 1997, pp. 927–936.*

C.Maleville et al., "Multiple SOI layers by mulitple Smart–Cut® transfers", 2000 IEEE International SOI Conference, Oct. 2000, pp. 134–135.*

* cited by examiner

METHOD FOR FORMING A SEMICONDUCTOR DEVICE FOR DETECTING LIGHT

FIELD OF THE INVENTION

The present invention relates to the field of semiconductor processing and, more particularly, to optoelectronic devices.

BACKGROUND OF THE INVENTION

A continuing object of integrated circuit manufacturing is to increase the speed of operation. One obstacle is the speed at which signals for the source of information are sent to the integrated circuit. Optical devices are being investigated to increase the speed of operation by using light as opposed to an electrical signal as the source.

Since silicon substrates are typically used to form integrated circuits, it is desirable to build the optical devices with integrated circuitry on silicon substrates. However, the physical properties of silicon, such as its low absorption coefficient compared to germanium, make optoelectronic devices in silicon inefficient. One way to increase the efficiency is to form a resonant cavity detector within a silicon substrate. A resonant cavity detector includes, two mirrors or distributed Bragg reflectors (DBR) vertically separated from each other by a silicon layer. When light is applied to the resonant cavity device the mirrors bounce the light between each other and multiply the light intensity. The greater the light intensity the more number of electron and hole pairs will be formed in the silicon to transmit a signal.

If the silicon layer between the two mirrors is polysilicon, the current flowing in the absence of radiation (dark current) is large, which decreases the efficiency of the device. However, monocrystalline silicon has a low dark current and is therefore used as the silicon layer in resonant cavity devices.

One way the prior art forms a resonant cavity device with a monocrystalline silicon layer between the mirrors is to form the bottom mirror, etch two holes within the bottom mirror to expose the underlying silicon substrate and epitaxially grow silicon through the two holes and laterally across the top surface of the bottom mirror. Afterwards, the upper mirror is formed within the epitaxially grown silicon. By growing the semiconductor material laterally across the top surface of the bottom mirror the semiconductor material also grows vertically to a thickness much greater than desired. To reduce the thickness of the epitaxial layer, a chemical mechanical polish (CMP) or etch back step is needed. This process is undesirable for manufacturability because the epitaxial growth process is slow and the CMP or etch back step increases cycle time by adding additional steps. Additionally, the epitaxial growth introduces defects in the epitaxially grown silicon at the locations where the lateral overgrowth of the silicon meets over the top surface of the mirror. Thus, a more manufacturable process to form a monocrystalline semiconductor material between two mirrors in an optical device is needed.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A method of forming a resonant cavity device useful for optoelectronic applications is formed by wafer bonding a semiconductor material, such as a silicon-comprising material, to a stack of reflective layers formed over a semiconductor substrate. In one embodiment, the resonant cavity device can be formed on a semiconductor substrate before the formation of a transistor.

Figure 1:
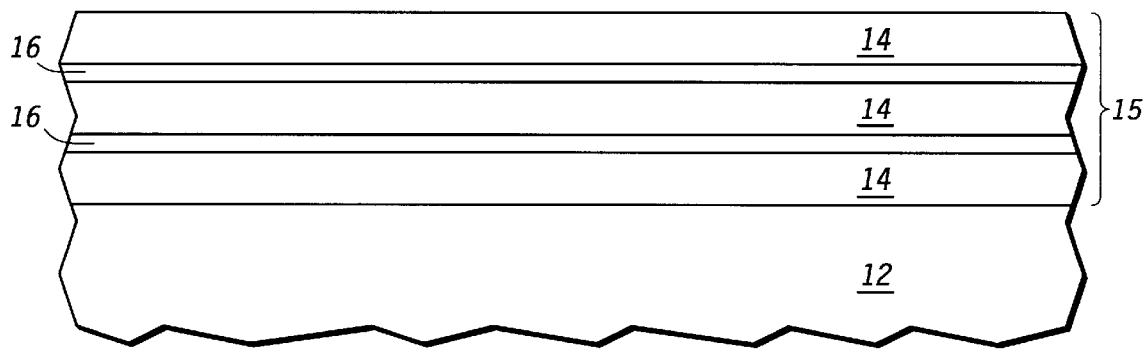
FIGS. 1–4 illustrate cross-sectional views of a portion of a semiconductor substrate during a process flow to form a resonant cavity device in accordance with an embodiment of the present invention.

FIG. 1 illustrates a portion of a semiconductor device 10 including a first semiconductor substrate 12 and a bottom reflective stack or bottom mirror 15 that includes first reflective layers 14 and second reflective layers 16. The first semiconductor substrate 12 can be any semiconductor material and is preferably a silicon-comprising wafer, such as a silicon monocrystalline wafer.

As used herein a mirror reflects a desired wavelength of light, wherein a desired wavelength of light is the wavelength of light that carries information and is captured by a photodetector. For optical devices, the desired wavelengths of light are most typically 850 nanometers, 1310 nanometers, and 1510 nanometers.

As used herein a reflective stack is a stack of alternating layers of materials having different refractive indices, which together function as a mirror. Each layer has a thickness within the reflective stack that is dependent upon 1) the wavelength of light that will subsequently be applied to the semiconductor device 10 and 2) the refractive index of the material in accordance with equation 1. In equation 1 below, t is the thickness of the layer, λ is the wavelength of the incident light and n is the index of refraction of the material.

$$t = \lambda/(4n) \quad (1)$$

For LAN (local area network) applications (less than approximately 1 km), the desired wavelength of light is approximately 850 nanometers; for metropolitan area network (MAN) applications (approximately 10 km), the wavelength is 1310 nanometers and for wide area networks (WAN) applications (approximately 40–100 km), the desired wavelength is approximately 1510 nanometers.

In one example of the invention, the semiconductor device 10 can be used in LAN applications (λ=850 nanometers) as follows. In one embodiment, a reflective stack 15 of silicon dioxide ($SiO_2$) and polysilicon is used. Because the index of refraction for silicon dioxide is approximately 1.4, the $SiO_2$ layer is about 146 nanometers. Polysilicon has an index of refraction of approximately 3.6, and, thus, the thickness of the polysilicon layer is about 54 nanometers. To achieve the desirable refractive properties, the reflective stack 15 and the corresponding layers above and below the reflective stack must have alternating indices of refraction with the layers above and below the reflective stack being a material with a higher index of refraction relative to the layer of the reflective stack that is in contact with them. In the preferred embodiment, the reflective stack 15 is formed between layers of monocrystalline silicon, which has an index of refraction approximately equal to that of polysilicon. Thus the bottom-most and top-most layers in the reflective stack 15, which in FIG. 1 are the first reflective layer 14, should have an index of refraction less than that of monocrystalline silicon and the second reflective layers 16. Therefore, silicon dioxide is a suitable material for the first reflective layers 14, and polysilicon is a suitable material for the second reflective layers 16.

Other materials can be used in the bottom reflective stack 15. For example, the first reflective layer could be $SiO_2$ and the second reflective layer could be a nitride such as silicon nitride. The layers of the bottom reflective stack 15 can be formed by thermal growth, CVD (chemical vapor deposition), PVD (physical vapor deposition), ALD (atomic layer deposition), the like or combinations of the above. However, it is not necessary that each layer be formed by the same process. For example, the first reflective layer 14 in contact with the first silicon substrate 12 can be a thermally grown $SiO_2$ layer. Afterwards, all the second reflective layers 16 and the remaining first reflective layers 14 can be formed by CVD, for example.

The number of alternating layers within the bottom reflective stack 15 can vary. Five layers are shown in the FIG. 2 for illustrative purposes only. However, the bottom reflective stack 15 has at least two layers of alternating materials. When the layers above and below the reflective stack are monocrystalline silicon, the number of layers in the bottom reflective stack 15 will be odd in order to achieve the necessary reflection characteristics. Also note that in one embodiment, the bottom reflective stack 15 may be inlaid within the first semiconductor substrate 12.

Figure 2:
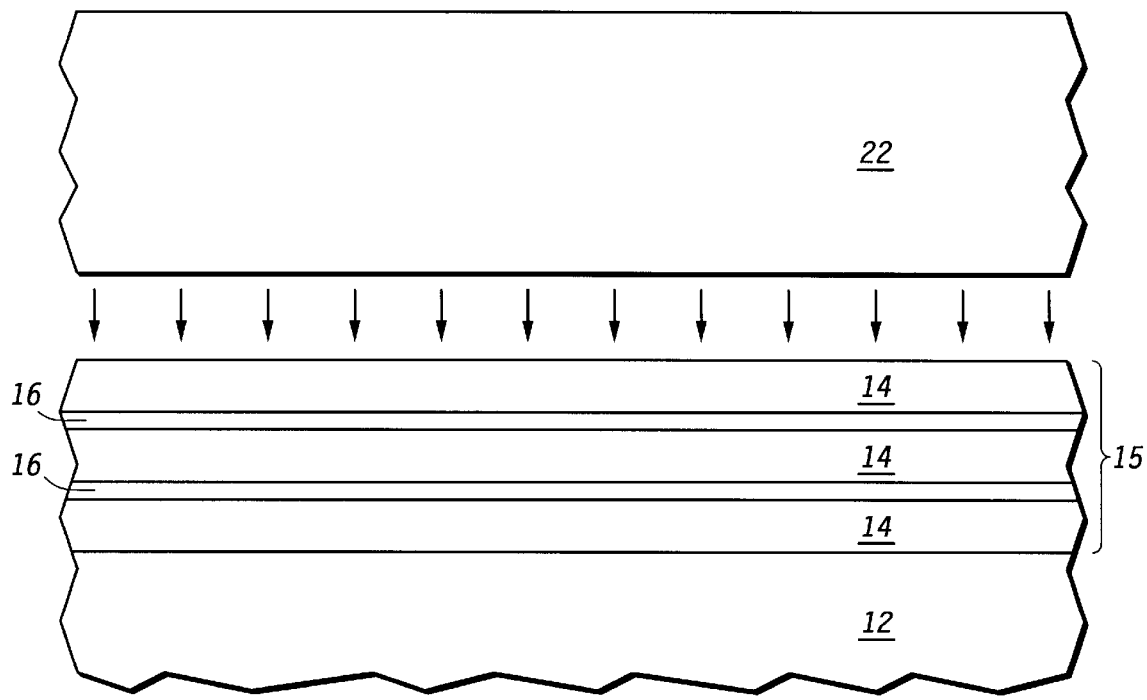

FIG. 2 illustrates the semiconductor device 10 and a separate second semiconductor substrate or semiconductor layer 22 prior to wafer bonding. The semiconductor layer 22 can be any semiconductor material, such as a silicon-comprising material and preferably is a silicon monocrystalline wafer. The second semiconductor substrate 22 can be the same material or a different material than the first semiconductor substrate 12.

Figure 3:
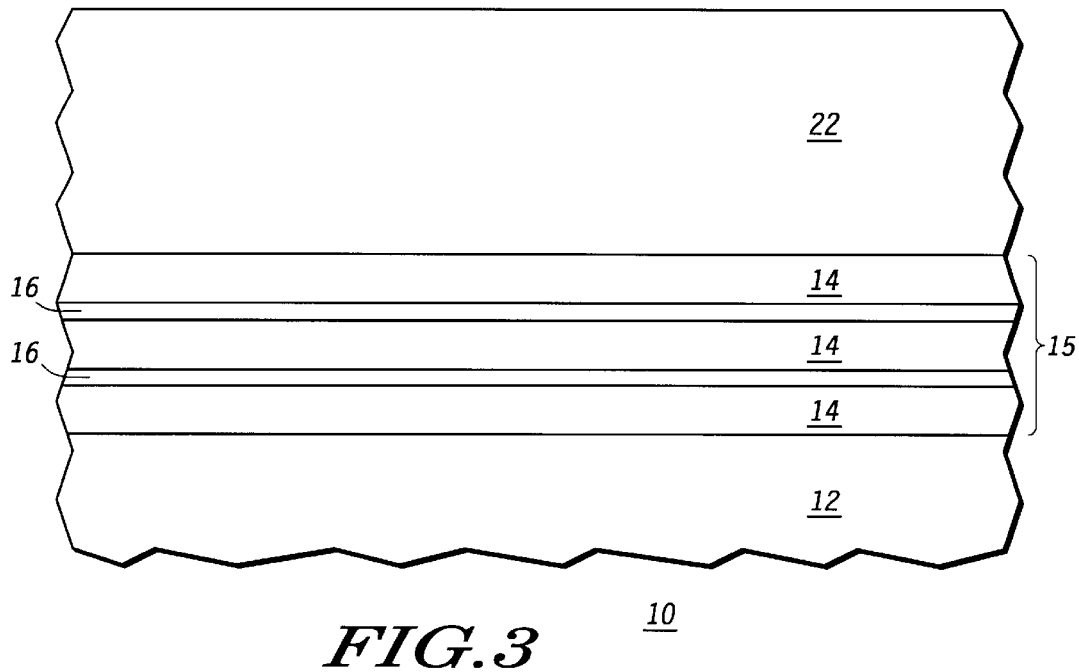

In accordance with one embodiment of the present invention, the second substrate 22 can be bonded to the semiconductor device 10 by pressing the second semiconductor substrate 22 together with the semiconductor device 10 at a high temperature. Approximately 1000° C. to 1200° C. is useful for the high temperature. In addition, this temperature range can be used to anneal the wafers after pressing them together to increase the strength of the bonds, if desired. The anneal time is usually on an order of magnitude of a couple of hours. For example, the anneal time may be between one to five hours. Other temperatures and anneal times may be used. After attaching the semiconductor layer 22 to the semiconductor device 10, a portion of the second substrate 22 may be removed, if needed, by grinding, polishing or a cleaving process to form the desired thickness of the monocrystalline layer over the bottom reflective stack 15. According to one embodiment, this desired thickness may be in a range of approximately 0.5 microns to 10 microns, or, alternatively, in a range of approximately 0.5 microns to 5 microns. Therefore, the desired thickness may be any thickness that results in a resonant cavity. For example, in one embodiment, the desired thickness may be approximately 1 micron. The resulting semiconductor device 10 (without the optional thinning) is shown in FIG. 3.

Generally, any wafer bonding processing can be used to bond a semiconductor substrate to the reflective stack, such as, for example, those described in U.S. Pat. No. 6,312,797, U.S. Pat. No. 6,284,629, and U.S. Pat. No. 6,180,496. The present invention is not limited by the process used for wafer bonding or, if necessary, cleaving.

Figure 4:
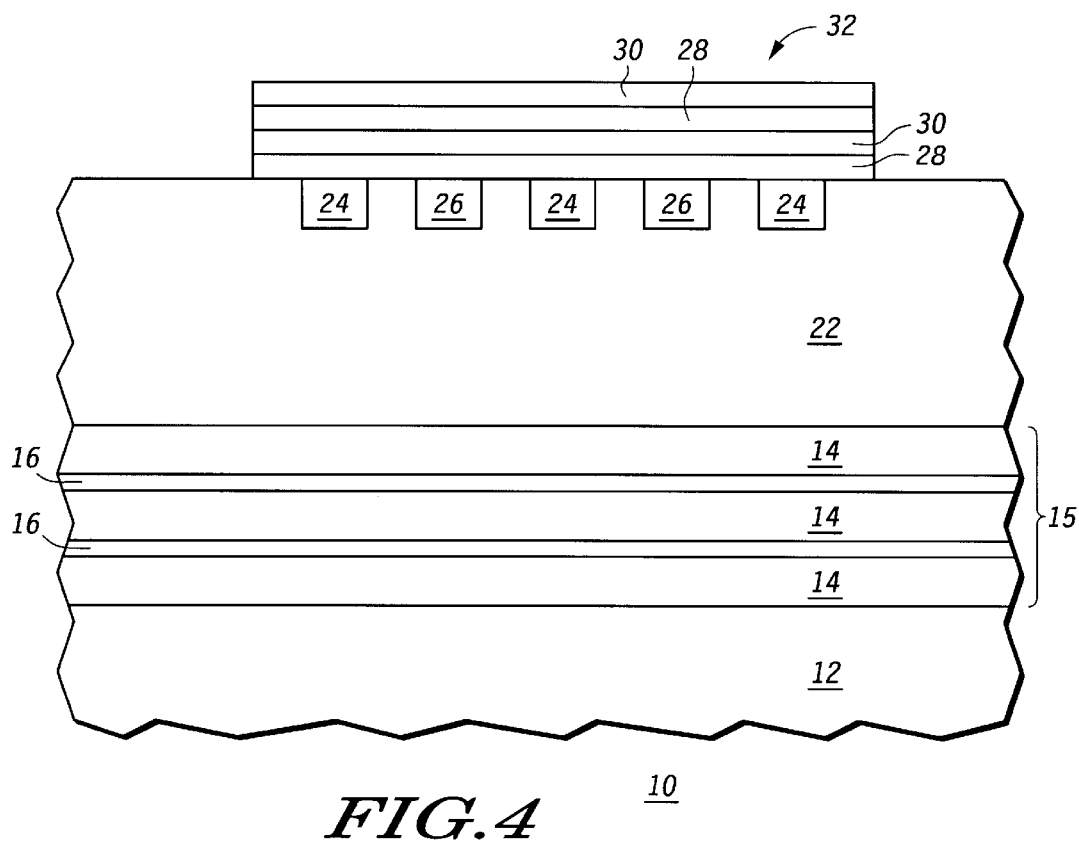

FIG. 4 shows the semiconductor device 10 after the formation of a top reflective stack 32 over the second semiconductor substrate 22. To form the top reflective stack 32, first, electrodes 24 and 26 are formed within a top portion of the semiconductor layer 22. In one embodiment of the present invention, N type electrodes 24 are formed by depositing a first photoresist layer (not shown), patterning the first photoresist layer and performing an N-type ion implantation using the first photoresist layer as an implant mask. Afterwards P-type electrodes 26 are formed by removing the first photoresist layer, forming a second photoresist layer, patterning the second photoresist layer, and performing a P-type ion implantation process using the second photoresist layer as an implant mask. However, it is not necessary that the N-type implantation process be formed prior to the P-type implantation process. In addition, the electrodes 24 can be P-type and the electrodes 26 can be N-type. The electrodes 24 and 26 can also be formed during the formation of source and drain regions for transistors formed on other areas of the semiconductor device 10. Such transistor fabrication is well known in the art and therefore will not be described. Hence, the ion implantation doses and energies that are conventionally used for forming the source and drains of the transistors can be used for forming the electrodes 24 and 26.

After the source and drain regions of the transistors are formed, a silicidation process can be performed, where a salicide is formed over the source and drain regions and electrodes 24 and 26. However, silicidation is not necessary and the electrode instead can be masked during silicidation of the source and drain regions to avoid silicidation.

After forming the electrodes 24 and 26 and optionally siliciding them, the top mirror or top reflective stack 32 is formed. The top reflective stack 32 is also an alternating stack of materials with different refractive indices, like the bottom reflective stack 15. The top reflective stack 32 includes a third reflective layer 28 and a fourth reflective layer 30. The third reflective layer 28 can be the same material as the first reflective layer 14 in the bottom reflective stack 15 and the fourth reflective layer 30 can be the same material as the second reflective layer 16 in the bottom reflective stack 15. However, it is not necessary the same materials be used.

The top reflective stack 32 generally reflects less light than the bottom reflective stack 15 in order to maximize the light entering the optical device 10. In one embodiment, the top reflective stack 32 reflects approximately 30 percent of incident light and the bottom reflective stack 15 reflects approximately 95 percent of incident light. This can be achieved by having fewer layers in the top reflective stack 32 as compared to the bottom reflective stack 15. Although the number of layers for the top reflective stack 32 in FIG. 4 is for illustrative purposes only, there are at least two layers of alternating materials. Like the bottom reflective stack 15, the materials over and under the top reflective stack 32 should have indices of refraction greater than the layers of the top-reflective stack 32 they are in contact with. Any process can be used to form the third reflective layer 28 and the fourth reflective layer 30 such as thermal growth, CVD, PVD, ALD, combinations of the above or the like. Again, it is not necessary that each layer be formed by the same process. After the formation of the top reflective stack 32, traditional CMOS (Complementary Metal-Oxide-Semiconductor) processing may be continued to form the gate electrodes for transistors and metal interconnects, for example. Once the top reflective stack 32 is formed, the semiconductor device 10 is a resonant cavity device.

Figure 5:
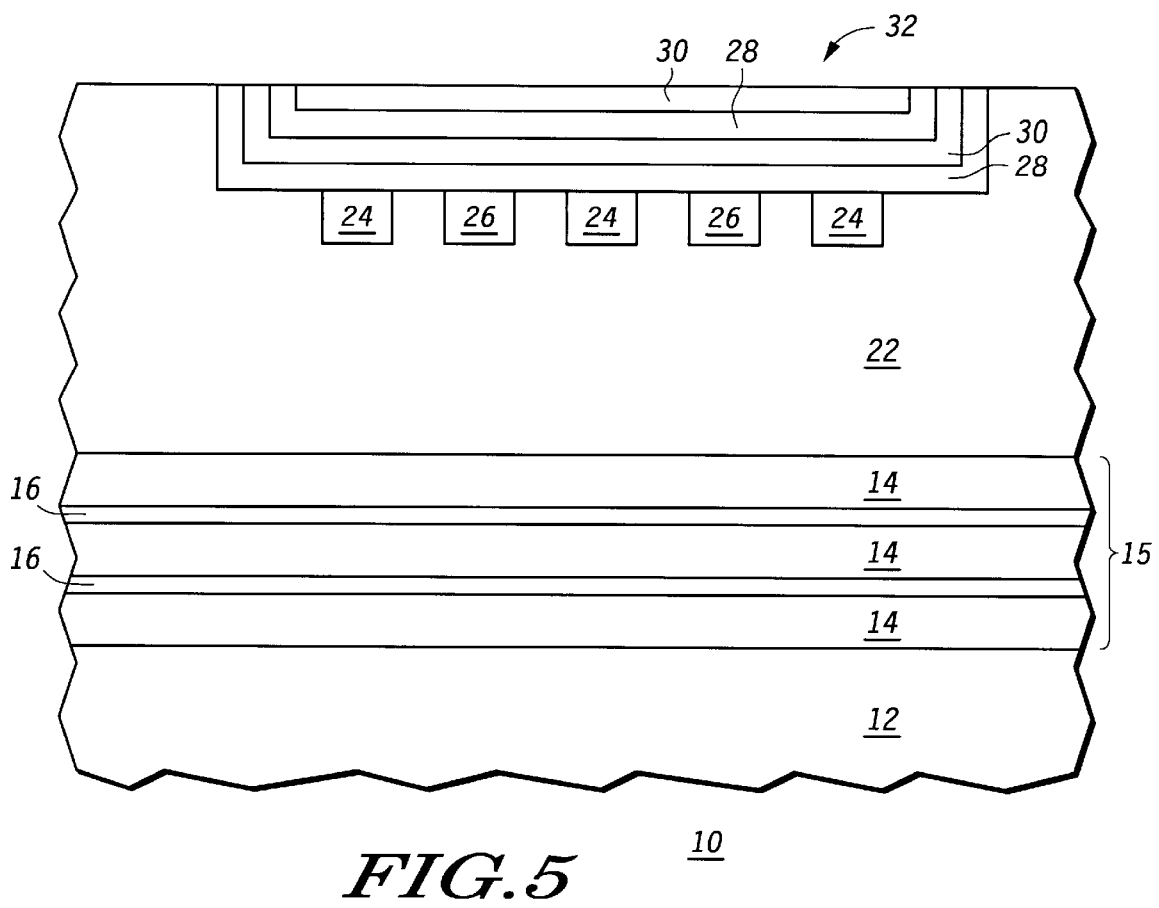
FIG. 5 illustrates an alternate embodiment of FIG. 4 also in accordance with the present invention.

FIG. 5 shows an alternate embodiment of forming the top reflective stack 32, where the top reflective stack 32 is inlaid, meaning at least a portion of the top reflective stack 32 lies within the second semiconductor substrate 22. Prior to depositing the third and fourth reflective layers 28 and 30, a trench is etched in the second semiconductor substrate 22. Afterwards, the electrodes 24 and 26 are formed as previously described. Next, the third and fourth reflective layer 28 and 30 are formed within at least a portion of the trench by thermal growth, CVD, PVD, ALD, the like and combinations of the above. Portions of the third and fourth reflective layers 28 and 30 may lie outside the trench and can be removed by CMP or an etch process. Although FIG. 5 shows all the layers of the top reflective stack 32 within the trench, some of the layers may lie within the trench and others over and outside the trench.

A skilled artisan should recognize that the formation of a resonant cavity device using the described processes is a simple process, easily manufacturable, and compatible with existing semiconductor technology and fabrication processes. In addition, the quality of the semiconductor material between the reflective stacks is improved over materials formed by other techniques, such as a lateral epitaxial growth material.

Although the invention has been described with respect to specific conductivity types or polarity of potentials, skilled artisans appreciated that conductivity types and polarities of potentials may be reversed.

Moreover, the terms front, back, top, bottom, over, under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device for detecting light, the method comprising:
   providing a semiconductor substrate;
   forming a first reflective stack overlying the semiconductor substrate;
   wafer bonding a semiconductor layer to the first reflective stack wherein the semiconductor layer overlies the first reflective stack;
   forming a plurality of electrodes within a top portion of the semiconductor layer; and
   forming an inlaid second reflective stack within the semiconductor layer and overlying the plurality of electrodes.

2. The method of claim 1, wherein each of the first and second reflective stacks comprises a first reflective layer having a first refraction index and a second reflective layer having a second refraction index, the second refraction index being greater than the first refraction index.

3. The method of claim 2, wherein the first reflective layer of the first reflective stack comprises an oxide, and the second reflective layer of the first reflective stack comprises a polycrystalline material.

4. The method of claim 1, wherein the semiconductor substrate comprises silicon and the semiconductor layer comprises monocrystalline silicon.

5. The method of claim 4, wherein each of the first and second reflective stacks comprises at least two layers of alternating materials having different refraction indices.

6. The method of claim 5, wherein one of the at least two alternating layers of the first reflective stack comprises an element selected from a group consisting of silicon and nitrogen, and another one of the at least two alternating layers of the first reflective stack comprises oxygen.

7. The method of claim 1, wherein the first reflective stack, second reflective stack, and semiconductor layer form a resonant cavity.

8. The method of claim 1, wherein the silicon-containing layer is wafer bonded to the reflective stack prior to forming a transistor within the silicon-containing substrate.

9. The method of claim 1, wherein the forming a plurality of electrodes is performed after the wafer bonding.

* * * * *